US008864861B2

(12) United States Patent
Andersson et al.

(10) Patent No.: US 8,864,861 B2
(45) Date of Patent: Oct. 21, 2014

(54) NANOLAMINATED COATED CUTTING TOOL

(75) Inventors: Jon Andersson, Vasteras (SE); Rachid M'Saoubi, Fagersta (SE); Tommy Larsson, Angelsberg (SE); Mats Johansson, Linkoping (SE); Per Alm, Fagersta (SE)

(73) Assignee: Seco Tools AB, Fagersta (SE)

( * ) Notice: Subject to any disclaimer, the term of this patent is extended or adjusted under 35 U.S.C. 154(b) by 320 days.

(21) Appl. No.: 13/375,602

(22) PCT Filed: May 28, 2010

(86) PCT No.: PCT/SE2010/050581
§ 371 (c)(1),
(2), (4) Date: Jan. 24, 2012

(87) PCT Pub. No.: WO2010/140959
PCT Pub. Date: Dec. 9, 2010

(65) Prior Publication Data
US 2012/0114437 A1     May 10, 2012

(30) Foreign Application Priority Data

Jun. 1, 2009   (SE) ...................................... 0900738

(51) Int. Cl.
    *C23C 14/00*        (2006.01)
    (Continued)

(52) U.S. Cl.
    CPC ............... *C04B 41/89* (2013.01); *C04B 41/009* (2013.01); *C04B 41/52* (2013.01);
    (Continued)

(58) Field of Classification Search
    CPC .... B23B 27/148; C04B 35/583; C04B 41/87; C04B 41/89; C22C 29/16; C23C 14/064; C23C 14/241; B23P 15/28

USPC ........... 51/307, 309; 428/216, 336, 469, 472, 428/697, 698, 699, 704; 204/192.1
See application file for complete search history.

(56) References Cited

U.S. PATENT DOCUMENTS

| | | |
|---|---|---|
| 5,330,853 A | 7/1994 | Hofmann et al. |
| 5,503,912 A | 4/1996 | Setoyama et al. |

(Continued)

FOREIGN PATENT DOCUMENTS

| | | |
|---|---|---|
| EP | 0588350 A2 | 3/1994 |
| EP | 0709483 | 5/1996 |

(Continued)

OTHER PUBLICATIONS

International Search Report dated Sep. 3, 2010, corresponding to PCT application.

*Primary Examiner* — Archene Turner
(74) *Attorney, Agent, or Firm* — Young & Thompson

(57) ABSTRACT

A cutting tool insert for machining by chip removal includes a body of polycrystalline cubic boron nitride compact (PCBN), either as a solid insert or attached to a backing body, onto which a hard and wear resistant PVD coating is deposited. The coating includes a polycrystalline nanolaminated structure of alternating A and B layers, where layer A is (Ti,Al,Me1)N and Me1 is one or more of the metal elements from group 3, 4, 5 or 6 in the periodic table, layer B is (Ti,Si,Me2)N and Me2 is one or more of the metal elements from group 3, 4, 5 or 6 in the periodic table including Al with a thickness between 0.5 and 10 μm. The insert is particularly useful in metal cutting applications generating high temperatures, e.g., high speed machining of steels, cast irons, super alloys and hardened steels.

20 Claims, 1 Drawing Sheet

(51) Int. Cl.
*C04B 41/89* (2006.01)
*C04B 41/00* (2006.01)
*C04B 41/52* (2006.01)
*C23C 14/06* (2006.01)
*C23C 30/00* (2006.01)

(52) U.S. Cl.
CPC ........... *C23C 14/0641* (2013.01); *C23C 30/005* (2013.01); *B23B 2224/24* (2013.01); *B23B 2226/125* (2013.01); *B23B 2228/08* (2013.01); *B23B 2228/10* (2013.01)
USPC .......... 51/307; 204/192.1; 428/216; 428/336; 428/469; 428/472; 428/697; 428/699

(56) References Cited

U.S. PATENT DOCUMENTS

| | | | |
|---|---|---|---|
| 6,077,596 A | 6/2000 | Hashimoto et al. | |
| 6,103,357 A | 8/2000 | Selinder et al. | |
| 6,254,984 B1 | 7/2001 | Iyori | |
| 6,309,738 B1 | 10/2001 | Sakurai | |
| 6,316,094 B1 * | 11/2001 | Fukaya et al. | 428/704 |
| 6,586,122 B2 * | 7/2003 | Ishikawa et al. | 428/698 |
| 6,599,062 B1 | 7/2003 | Oles et al. | |
| 7,056,602 B2 | 6/2006 | Horling et al. | |
| 8,003,232 B2 * | 8/2011 | Johansson et al. | 428/697 |
| 2005/0202283 A1 | 9/2005 | Gates, Jr. et al. | |
| 2006/0182999 A1 | 8/2006 | Yamamoto | |
| 2006/0246320 A1 | 11/2006 | Kathrein et al. | |
| 2006/0292399 A1 * | 12/2006 | Sjolen et al. | 428/698 |
| 2007/0032369 A1 * | 2/2007 | Franzen | 51/307 |
| 2008/0075543 A1 | 3/2008 | Zhu et al. | |

FOREIGN PATENT DOCUMENTS

| | | | |
|---|---|---|---|
| EP | 1736565 A1 | | 12/2006 |
| EP | 1939327 A1 | | 7/2008 |
| JP | 59-097579 | * | 6/1984 |
| JP | 08-127862 | | 5/1996 |
| JP | 08-197306 | * | 8/1996 |
| JP | 2000326107 A | | 11/2000 |
| JP | 2000-334606 | * | 12/2000 |
| JP | 2000334607 A | | 12/2000 |
| JP | 3347687 | | 11/2002 |
| JP | 2006-225708 | * | 8/2006 |
| JP | 2006-528076 | | 12/2006 |
| JP | 2010076084 A | | 4/2010 |
| WO | 2005000518 | | 1/2005 |

* cited by examiner

NANOLAMINATED COATED CUTTING TOOL

BACKGROUND OF THE INVENTION

The present invention relates to a cutting tool insert comprising a body of cubic boron nitride compact (PCBN) material and a hard and wear resistant coating comprising a nanolaminated structure based on (Ti,Al)N and (Ti,Si)N layers, respectively. This insert is particularly useful in metal cutting applications generating high temperatures, e.g., high speed machining of steels, cast irons, super alloys, stainless steels and hardened steels. The coating is grown by physical vapour deposition (PVD) and preferably by cathodic arc evaporation.

U.S. Pat. No. 7,056,602 discloses a cutting tool insert coated with a cubic structured $(Ti_yAl_xMe_{1-x-y})N$ based layer where Me is one of the elements: Zr, Hf, V, Nb, Ta, Cr, Mo, W or Si, and: x is between 0.50 and 0.80; the ratio, x/(x+y), is between 0.50 and 0.85; the sum of the Ti and Al subscripts, x+y, is between 0.7 and 1.0.

EP 1736565 discloses a cutting tool cubic boron nitride based insert coated with a cubic structured (Me,Si)X phase, where Me is one or more of the elements Ti, V, Cr, Zr, Nb, Mo, Hf, Ta and Al, and X is one or more of the elements N, C, O or B.

EP 0588350 discloses a hard layer of Ti—Si—N composite material on a body, the layer being deposited using a source of evaporation possessing a composition of $Ti_aSi_b$ with a in the range of 75-85 at % and b 15-25 at %.

Coating optimization has also been obtained by applying different concepts of multilayers as; alternating Ti and Al containing layers (U.S. Pat. No. 6,309,738), oxygen and non-oxygen containing layers (U.S. Pat. No. 6,254,984), one of the layers stacked in the multilayer consists itself of a multilayer (U.S. Pat. No. 6,077,596), alternating nitrogen content (U.S. Pat. No. 5,330,853) or using one metastable compound (U.S. Pat. No. 5,503,912) or as aperiodic multilayer (U.S. Pat. No. 6,103,357).

Further improvements in thermal stability and hardness have been achieved by the introduction of Si into TiN- or TiAlN-based coatings. JP 2000-334607 discloses a coated tool with laminated layers comprising TiSi (layer a) and TiAl (layer b) compounds. The (a) layer is selected among nitride, carbonitride, oxynitride and oxycarbonitride containing 10%<Si<60% with a NaCl type crystalline structure. Layer (b) is selected among nitride, carbonitride, oxynitride and oxycarbonitride containing 40%<Al<75% with a NaCl type crystalline structure. The (a) layer and (b) layers are applied alternately by each one layer or more and the (b) layer is located just above the surface of the base material.

EP 1939327 discloses a cutting tool comprising a hard coating giving improved crater and flank wear resistance, said coating comprising an aperiodic multilayer X+Y+X+Y+ . . . with average layer thickness of X and Y layers of between 0.1 and 100 nm and with average chemical composition $Al_aTi_b$-$Si_cCr_dC_eN_{1-e}$, where 0<a<0.5, 0.1<b<0.9, 0.01<c<0.17, 0≤d<0.06, a+b+c+d=1, and 0≤e<1.

The trends towards dry-work processes for environmental protection, i.e., metal cutting operation without using cutting fluids (lubricants) and accelerated machining speed with improved process put even higher demands on the characteristics of the tool materials due to an increased tool cutting-edge temperature. In particular, coating stability at high temperatures, e.g., oxidation- and wear-resistance have become even more crucial.

SUMMARY OF THE INVENTION

It is an object of the present invention to provide a coated cutting tool yielding improved performance in metal cutting applications at elevated temperatures.

It is a further object of the present invention to provide a coated cutting tool with improved edge integrity.

It has been found that combining layers based on (Ti,Si)N and (Ti,Al)N, respectively, in a nanolaminated coating structure onto a cubic boron nitride based cutting tool insert significantly improves the tool life due to increased crater wear resistance, flank wear resistance and edge integrity, especially in high speed machining operations generating high tool temperatures.

DETAILED DESCRIPTION OF THE INVENTION

Figure 1:
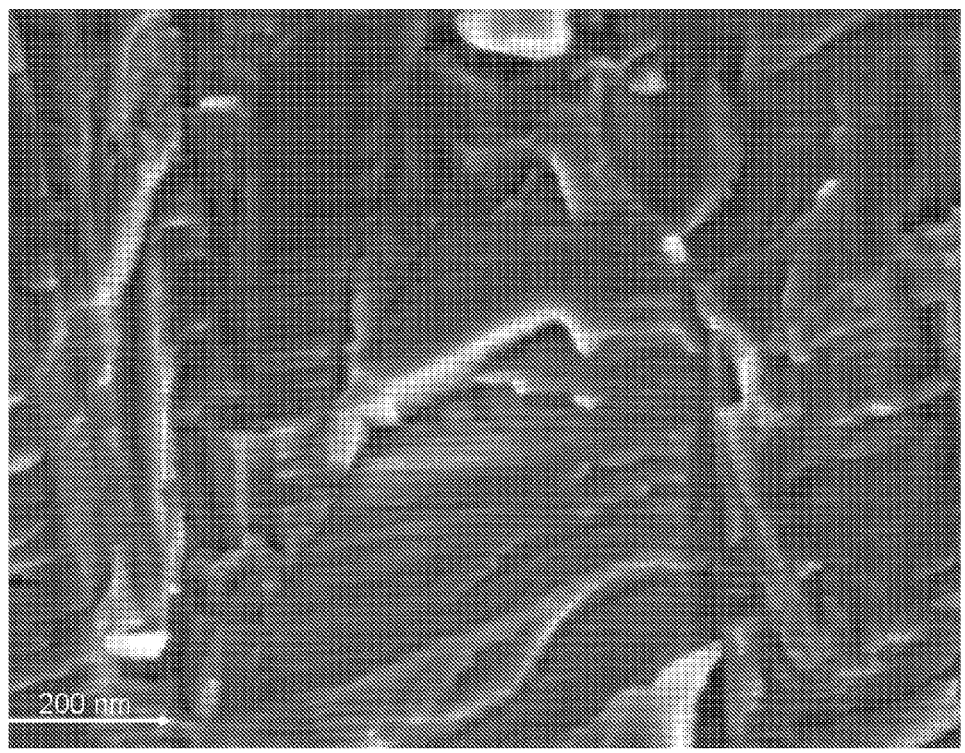
FIG. 1; Scanning electron microscopy (SEM) image showing a fractured cross section of a $Ti_{0.38}Al_{0.62}N/Ti_{0.86}Si_{0.14}N$ nanolaminated structure.

According to the present invention, there is provided a cutting tool for machining by chip removal comprising a body of polycrystalline cubic boron nitride compact (PCBN), either as a solid insert or attached to a backing body, onto which is deposited a hard and wear resistant coating comprising a polycrystalline nanolaminated structure of alternating A and B layers with a thickness between 0.5 and 10 µm, preferably between 0.5 and 5 µm, and with an overall columnar structure. The average column width is between 20 and 1000 nm, preferably between 20 and 500 nm, as determined by, e.g., cross section scanning electron microscopy of a middle region of the nanolaminated structure, i.e., in a region within 30 to 70% of the thickness in the growth direction, and said average columnar width is the average from measuring the width of at least ten adjacent columns.

Said layer A is $(Ti_{1-x-p}Al_xMe1_p)N_a$, where 0.3<x<0.95, preferably 0.45<x<0.75, and 0.90<a<1.10, preferably 0.96<a<1.04, 0≤p<0.15, and Me1 is one or more of the metal elements from group 3, 4, 5 or 6 in the periodic table, preferably one or more of Zr, Y, V, Nb, Mo and W, most preferably one or more of Zr, Y, V and Nb. Said layer B is $(Ti_{1-y-z}Si_yMe2_z)N_b$, where 0.05<y≤0.25 preferably 0.05<y<0.18, 0≤z<0.4, 0.9<b<1.1, preferably 0.96<b<1.04, and Me2 is one or more of the metal elements from group 3, 4, 5 or 6 in the periodic table including Al, preferably one or more of Y, V, Nb, Mo, W and Al, most preferably one or more of Y, V, Nb and Al. Layers A and B have an average individual layer thickness between 1 nm and 50 nm, as measured by, e.g., cross sectional transmission electron microscopy of a middle region of the nanolaminated structure, i.e., a region within 30 to 70% of the thickness in the growth direction, and said average layer thickness is the average from measuring the thickness of at least ten adjacent layers. Said nanolaminated structure comprises a phase mixture of cubic and hexagonal phases, preferably only cubic phases, as determined by X-ray diffraction.

In a first preferred embodiment z=p=0.

In a second preferred embodiment Me1 is one or more of Zr, Y, V and Nb with 0<p<0.05.

In a third preferred embodiment Me2 is Y, $0<z<0.15$.

In a fourth preferred embodiment Me2 is one or both of V and Nb with $0<z<0.3$.

In a fifth preferred embodiment Me2 is Al, $0.2<z<0.4$.

The average composition of said nanolaminated structure is 45 at %<Ti+Al+Si+Y+V+Nb+Mo+W+Zr<55 at %, preferably 48 at %<Ti+Al+Si+Y+V+Nb+Mo+W+Zr<52 at % and rest N as determined by, e.g., EDS or WDS techniques.

Said coating may comprise an inner single- and/or multilayer coating of TiN, TiC, Ti(C,N) or (Ti,Al)N, preferably (Ti,Al)N, and/or an outer single- and/or multilayer coating of TiN, TiC, Ti(C,N), (Ti,Si)N or (Ti,Al)N, preferably (Ti,Si)N or (Ti,Al)N, according to known art, to a total coating thickness, including the thickness of the nanolaminated structure, of between 0.5 and 20 μm, preferably between 0.5 and 10 μm, and most preferably between 0.5 and 7 μm.

Said PCBN body contains at least 30 vol % of cubic phase boron nitride (cBN) in a binder. The binder contains at least one compound selected from a group consisting of nitrides, borides, oxides, carbides and carbonitrides of one or more of the elements belonging to the groups 4, 5 and 6 of the periodic table and Al, e.g., Ti(C,N) and AlN.

In a sixth preferred embodiment, said PCBN body contains 30 vol %<cBN<70 vol %, preferably 40 vol %<cBN<65 vol %, with an average cBN grain size between 0.5 μm and 4 μm. The binder contains 80 wt %<Ti(C,N)<95 wt % and rest containing mainly other compounds comprising two or more of the elements Ti, N, B, Ni, Cr, Mo, Nb, Fe, Al and/or O, e.g., $TiB_2$ and $Al_2O_3$.

In a seventh preferred embodiment, said PCBN body contains 45 vol %<cBN<70 vol %, preferably 55 vol %<cBN<65 vol %, with an average cBN grain size between 0.5 μm and 4 μm, preferably between 1 μm and 3 μm. The binder contains 80 wt %<Ti(C,N)<90 wt %, 1 wt. %<alloy containing one or more of the elements Ni, Co, Cr and/or Mo<10 wt %, and rest containing mainly $TiB_2$ and $Al_2O_3$.

In an eighth preferred embodiment, said PCBN body contains 70 vol %<cBN, preferably 80 vol %<cBN<95 vol %, with an average cBN grain size either between 0.5 μm and 10 μm, preferably between 1 μm and 6 μm, or between 10 μm and 25 μm, preferably between 15 μm and 25 μm. The binder contains compounds of two or more of the elements Al, B, N, W, Co, Ni, Fe, Al and/or O.

The deposition method for the coatings of the present invention is based on cathodic arc evaporation of an alloy or composite cathode under the following conditions; (Ti,Al,Me1)N and (Ti,Si,Me2)N layers are grown from cathodes yielding the desired layer composition. The evaporation current is between 50 A and 200 A. The layers are grown in an Ar+$N_2$ atmosphere, preferably in a pure $N_2$ atmosphere, at a total pressure of 0.5 Pa to 9.0 Pa, preferably 1.5 Pa to 5.0 Pa. The bias is −10 V to −300 V, preferably −20 V to −200 V. The deposition temperature is between 350° C. and 700° C., preferably between 400° C. and 650° C.

The invention also relates to the use of cutting tool inserts according to the above for machining of steels, cast irons, super alloys and hardened steels at cutting speeds of 50-2000 m/min, preferably 50-1500 m/min, with an average feed of 0.01-1.0 mm/rev, preferably 0.01-0.6 mm, depending on the cutting operation.

Example 1

The coatings of Table 1 were deposited by cathodic arc evaporation onto the following PCBN inserts:

S1 with 60 vol % cBN, an average cBN grain size of about 2 μm and a binder containing 86 wt % Ti(C,N), 5 wt % ASTM F75 alloy (main composition: 62 wt % Co+28.5 wt % Cr+6 wt % Mo) and rest containing mainly $TiB_2$ and $Al_2O_3$.

S2 with 60 vol % cBN, an average cBN grain size of about 2 μm and a binder containing 86 wt % Ti(C,N), 5 wt % Inconel 625 alloy (main composition: 28.5 wt % Cr+9 wt % Mo+3 wt. % Nb+balance Ni) and rest containing mainly $TiB_2$ and $Al_2O_3$.

S3 with 50 vol % cBN, an average cBN grain size of about 1 μm and a binder containing 91 wt % Ti(C,N) and rest containing mainly $TiB_2$ and $Al_2O_3$.

S4 with 90 vol % cBN, an average cBN grain size of about 4 μm and a binder containing mainly AlN and rest containing mainly $AlB_2$.

S5 with 90 vol % cBN, an average cBN grain size of about 20 μm and a binder containing mainly AlN and rest containing mainly $AlB_2$.

Before deposition, the inserts were cleaned in ultrasonic baths of an alkali solution and alcohol. The deposition chamber was evacuated to a base pressure of less than $2.0 \times 10^{-3}$ Pa, after which the inserts were sputter cleaned with Ar ions. The coatings were deposited from alloy or composite cathodes in 99.995% pure $N_2$ atmosphere at a total pressure of 2-6 Pa, using a bias of −20 to −60 V and an evaporation current of 60-200 A. The cathodes were selected to yield the composition of Layer A and Layer B, respectively, and mounted on opposing sides of the deposition chamber in order to obtain the nanolaminated structure by fixture rotation. The average individual layer thickness was varied by altering the cathode current (60-200 A) and the rotation speed of the fixture (1-5 rpm). The total coating thicknesses were about 2 μm for all inserts and the deposition temperature was 450° C.

FIG. 1 shows an example of a scanning electron microscopy (SEM) image of a $Ti_{0.38}Al_{0.62}N/Ti_{0.86}Si_{0.14}N$ nanolaminated structure (coating 1) with a columnar microstructure that extends throughout the nanolaminated structure. The individual layers are clearly seen, indicating minimal intermixing between adjacent layers, and the individual layer thickness varies due to a 3-fold fixture rotation.

The total average composition of the coatings was measured by energy dispersive x-ray spectroscopy (EDS) analysis area using a LEO Ultra 55 scanning electron microscope with a Thermo Noran EDS detector operating at 10 kV. The data were evaluated using a Noran System Six (NSS ver 2) software.

TABLE 1

| Coating | Description | Composition Layer A (metal at.%) | | | | Composition Layer B (metal at.%) | | | | Average composition (at.%) | | | | | | Layer thickn. (nm) | |
|---|---|---|---|---|---|---|---|---|---|---|---|---|---|---|---|---|---|
| | | Ti | Al | Si | Me1 | Ti | Al | Si | Me2*** | Ti | Al | Si | Me1 | Me2*** | N | A | B |
| | Inventive | | | | | | | | | | | | | | | | |
| 1 | TiAlN/TiSiN* | 38 | 62 | 0 | 0 | 86 | 0 | 14 | 0 | 31.9 | 12.6 | 4.1 | 0.0 | 0.0 | 51.4 | 5 | 8 |
| 2 | TiAlN/TiSiN* | 38 | 62 | 0 | 0 | 86 | 0 | 14 | 0 | 39.1 | 5.7 | 5.6 | 0.0 | 0.0 | 49.6 | 4 | 17 |
| 3 | TiAlN/TiSiN* | 38 | 62 | 0 | 0 | 86 | 0 | 14 | 0 | 26.1 | 21.2 | 2.2 | 0.0 | 0.0 | 50.4 | 11 | 5 |
| 4 | TiAlN/TiSiN* | 38 | 62 | 0 | 0 | 86 | 0 | 14 | 0 | 34.3 | 11.8 | 4.5 | 0.0 | 0.0 | 49.4 | 3 | 5 |

TABLE 1-continued

| Coating | Description | Composition Layer A (metal at.%) | | | | Composition Layer B (metal at.%) | | | | Average composition (at.%) | | | | | | Layer thickn. (nm) | |
|---|---|---|---|---|---|---|---|---|---|---|---|---|---|---|---|---|---|
| | | Ti | Al | Si | Me1 | Ti | Al | Si | Me2*** | Ti | Al | Si | Me1 | Me2*** | N | A | B |
| 5 | TiAlN/TiSiN* | 38 | 62 | 0 | 0 | 86 | 0 | 14 | 0 | 27.9 | 18.5 | 2.9 | 0.0 | 0.0 | 50.6 | 24 | 17 |
| 6 | TiAlN/TiSiN*, **** | 38 | 62 | 0 | 0 | 86 | 0 | 14 | 0 | 32.9 | 12.7 | 4.3 | 0.0 | 0.0 | 50.1 | 5 | 8 |
| 7 | TiAlN/TiSiN*, ** | 38 | 62 | 0 | 0 | 86 | 0 | 14 | 0 | 31.4 | 14.4 | 3.8 | 0.0 | 0.0 | 50.3 | 7 | 8 |
| 8 | TiAlN/TiSiN* | 50 | 50 | 0 | 0 | 86 | 0 | 14 | 0 | 33.1 | 13.1 | 3.4 | 0.0 | 0.0 | 50.5 | 10 | 9 |
| 9 | TiAlN/TiSiN* | 38 | 62 | 0 | 0 | 93 | 0 | 7 | 0 | 35.3 | 13.6 | 1.9 | 0.0 | 0.0 | 49.1 | 6 | 8 |
| 10 | TiAlN/TiSiN* | 38 | 62 | 0 | 0 | 93 | 0 | 7 | 0 | 32.1 | 16.3 | 1.7 | 0.0 | 0.0 | 50.0 | 9 | 6 |
| 11 | TiAlN/TiSiN* | 50 | 50 | 0 | 0 | 93 | 0 | 7 | 0 | 38.7 | 10.4 | 2.0 | 0.0 | 0.0 | 48.9 | 5 | 6 |
| 12 | TiAlN/TiSiYN* | 38 | 62 | 0 | 0 | 84 | 0 | 12 | 4 | 29.5 | 16.7 | 2.8 | 0.0 | 1.0 | 50.1 | 11 | 10 |
| 13 | TiAlN/TiSiYN* | 38 | 62 | 0 | 0 | 83 | 0 | 9 | 8 | 31.9 | 12.8 | 2.6 | 0.0 | 2.3 | 50.4 | 4 | 6 |
| 14 | TiAlN/TiSiYN* | 38 | 62 | 0 | 0 | 79 | 0 | 7 | 14 | 28.7 | 16.7 | 1.6 | 0.0 | 3.3 | 49.8 | 8 | 7 |
| 15 | TiAlN/TiSiVN* | 38 | 62 | 0 | 0 | 82 | 0 | 11 | 7 | 32.5 | 13.9 | 3.1 | 0.0 | 2.0 | 48.5 | 7 | 9 |
| 16 | TiAlN/TiSiVN* | 38 | 62 | 0 | 0 | 76 | 0 | 9 | 15 | 27.0 | 17.7 | 2.1 | 0.0 | 3.3 | 50.0 | 10 | 8 |
| 17 | TiAlN/TiSiVN* | 50 | 50 | 0 | 0 | 70 | 0 | 7 | 23 | 32.4 | 9.5 | 2.1 | 0.0 | 7.1 | 48.8 | 5 | 8 |
| 18 | TiAlN/TiSiNbN* | 38 | 62 | 0 | 0 | 85 | 0 | 10 | 5 | 31.1 | 13.6 | 2.9 | 0.0 | 1.4 | 51.0 | 9 | 12 |
| 19 | TiAlN/TiSiNbN* | 38 | 62 | 0 | 0 | 78 | 0 | 8 | 14 | 27.9 | 16.8 | 1.9 | 0.0 | 3.3 | 50.1 | 8 | 7 |
| 20 | TiAlN/TiSiNbN* | 38 | 62 | 0 | 0 | 69 | 0 | 6 | 25 | 26.1 | 14.3 | 1.6 | 0.0 | 6.6 | 51.3 | 5 | 6 |
| 21 | TiAlN/TiSiAlN* | 38 | 62 | 0 | 0 | 67 | 21 | 12 | 0 | 29.4 | 18.4 | 3.6 | 0.0 | 0.0 | 48.6 | 5 | 8 |
| 22 | TiAlN/TiSiAlN* | 38 | 62 | 0 | 0 | 55 | 39 | 6 | 0 | 22.3 | 25.9 | 1.6 | 0.0 | 0.0 | 50.3 | 5 | 6 |
| 23 | TiAlN/TiSiAlN* | 38 | 62 | 0 | 0 | 60 | 32 | 8 | 0 | 24.5 | 22.6 | 2.1 | 0.0 | 0.0 | 50.7 | 6 | 7 |
| 24 | TiAlYN/TiSiN* | 38 | 61 | 0 | 1 | 86 | 0 | 14 | 0 | 34.0 | 11.9 | 4.2 | 0.4 | 0.0 | 49.8 | 6 | 9 |
| 25 | TiAlYN/TiSiN* | 37 | 59 | 0 | 4 | 86 | 0 | 14 | 0 | 34.4 | 12.3 | 4.2 | 1.0 | 0.0 | 49.1 | 5 | 7 |
| 26 | TiAlVN/TiSiN* | 38 | 61 | 0 | 1 | 86 | 0 | 14 | 0 | 32.6 | 11.7 | 4.2 | 0.4 | 0.0 | 51.5 | 5 | 8 |
| 27 | TiAlVN/TiSiN* | 37 | 59 | 0 | 4 | 86 | 0 | 14 | 0 | 34.7 | 12.6 | 3.9 | 1.0 | 0.0 | 48.8 | 6 | 8 |
| 28 | TiAlNbN/TiSiN* | 38 | 61 | 0 | 1 | 86 | 0 | 14 | 0 | 34.4 | 12.5 | 4.3 | 0.4 | 0.0 | 48.9 | 6 | 9 |
| 29 | TiAlNbN/TiSiN* | 37 | 59 | 0 | 4 | 86 | 0 | 14 | 0 | 34.3 | 11.2 | 4.2 | 1.0 | 0.0 | 50.3 | 5 | 8 |
| 30 | TiAlZrN/TiSiN* | 38 | 61 | 0 | 1 | 86 | 0 | 14 | 0 | 31.7 | 14.4 | 3.9 | 0.5 | 0.0 | 50.1 | 6 | 7 |
| 31 | TiAlZrN/TiSiN* | 37 | 59 | 0 | 4 | 86 | 0 | 14 | 0 | 32.4 | 13.3 | 4.0 | 1.1 | 0.0 | 50.3 | 7 | 9 |
| 32 | TiAlZrN/TiSiVN* | 38 | 61 | 0 | 1 | 76 | 0 | 9 | 15 | 29.3 | 13.0 | 2.6 | 0.4 | 4.3 | 50.8 | 5 | 7 |
| 33 | TiAlZrN/TiSiYN* | 37 | 59 | 0 | 4 | 84 | 0 | 12 | 4 | 33.8 | 11.3 | 3.7 | 0.9 | 1.2 | 49.9 | 5 | 8 |
| 34 | TiAlVN/TiSiAlN* | 37 | 59 | 0 | 4 | 60 | 32 | 8 | 0 | 23.7 | 22.9 | 2.1 | 0.9 | 0.0 | 51.3 | 6 | 7 |
| | Comparative | | | | | | | | | | | | | | | | |
| 35 | TiN/TiSiN* | 100 | 0 | 0 | 0 | 86 | 0 | 14 | 0 | 45.4 | 0.0 | 4.1 | 0.0 | 0.0 | 50.5 | 9 | 12 |
| 36 | TiAlSiN/TiSiN* | 61 | 32 | 7 | 0 | 93 | 0 | 7 | 0 | 36.7 | 9.5 | 3.5 | 0.0 | 0.0 | 50.3 | 10 | 7 |
| 37 | 1 | 80 | 20 | 0 | 0 | 93 | 0 | 7 | 0 | 44.0 | 5.0 | 1.8 | 0.0 | 0.0 | 49.2 | 9 | 9 |
| 38 | TiAlN/TiSiN*, ** | 38 | 62 | 0 | 0 | 86 | 0 | 14 | 0 | 27.6 | 19.2 | 2.7 | 0.0 | 0.0 | 50.6 | 130 | 80 |
| 39 | TiN/TiAlSiN*, ** | 100 | 0 | 0 | 0 | 61 | 32 | 7 | 0 | 39.3 | 8.7 | 1.9 | 0.0 | 0.0 | 50.1 | 110 | 130 |
| 40 | TiAlN | 37.6 | 62.4 | 0.0 | 0.0 | 0.0 | 0.0 | 0.0 | 0.0 | — | — | — | — | — | 50.4 | — | — |
| 41 | TiSiN | 86.4 | 0.0 | 13.6 | 0.0 | 0.0 | 0.0 | 0.0 | 0.0 | — | — | — | — | — | 49.5 | — | — |
| 42 | TiSiN | 92.8 | 0.0 | 7.2 | 0.0 | 0.0 | 0.0 | 0.0 | 0.0 | — | — | — | — | — | 49.6 | — | — |
| 43 | TiAlSiN | 61.1 | 32.0 | 6.9 | 0.0 | 0.0 | 0.0 | 0.0 | 0.0 | — | — | — | — | — | 50.0 | — | — |
| 44 | TiSiN + TiAlN** | 85.9 | 0.0 | 14.1 | 0.0 | 38.0 | 62.0 | 0.0 | 0.0 | | N (at. %): 51.1/49.5 | | | | | 1080 | 1250 |
| 45 | TiAlN + TiSiN** | 38.3 | 61.7 | 0.0 | 0.0 | 86.0 | 0.0 | 14.0 | 0.0 | | N (at. %): 50.1/50.5 | | | | | 1140 | 870 |

*Individual layer compositions are estimated from the corresponding single layers.
**Constant individual layer thicknesses.
***Me2 content excluding Al, which has its own column.
****A bottom $Ti_{0.38}Al_{0.62}N$ layer (0.3 μm thickness) and a top $Ti_{0.38}Al_{0.62}N$ layer (0.3 μm) were applied to a total coating thickness of 2 μm.

Example 2

Figure 2:
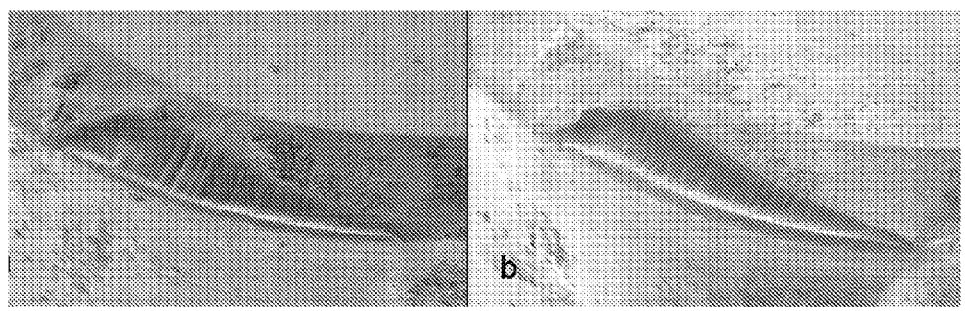
FIG. 2; Scanning electron microscopy (SEM) images showing examples of the cutting edges after 24 minutes of turning in case hardened steel with (a) $Ti_{0.86}Si_{0.14}N$ single layer and (b) $Ti_{0.38}Al_{0.62}N/Ti_{0.86}Si_{0.14}N$ nanolaminated structure.

Coatings 1, 3, 6, 40-45 on S1 and S2 inserts were tested under the following conditions:
Geometry: CNGA120408S
Application: Continuous turning
Work piece material: Case hardened steel (16MnCr5)
Cutting speed: 200 m/min
Feed: 0.1 mm/rev
Depth of cut: 0.15 mm
Tool life criteria: Edge failure
The results are shown in Table 2.
FIG. 2 shows SEM images of used edges of S1 inserts after 24 minutes turning with (a) comparative coating 41 and (b) inventive coating 1. It is clearly seen that the inventive coating show improved crater and edge wear characteristics.

Example 3

Coatings 1-6, 35, 36, 38-42, 44-45 on S3 inserts were tested under the following conditions:

Geometry: RCGN0803MOS
Application: Continuous turning
Work piece material: Case hardened steel (16MnCr5)
Cutting speed: 200 m/min
Feed: 0.1 mm/rev
Depth of cut: 0.15 mm
Tool life criteria: Edge failure
The results are shown in Table 2.

Example 4

Coatings 6, 37, 40, 41 on S4 inserts were tested under the following conditions:
Geometry: CNMN120412S
Application: Facing
Work piece material: AISI A48-40B
Cutting speed: 1100 m/min
Feed: 0.3 mm/rev
Depth of cut: 1 mm
Tool life criteria: Edge failure
The results are shown in Table 2.

Example 5

Coatings 6, 40, 41 on S5 inserts were tested under the following conditions:
Geometry: CNMN120412S
Application: Continuous turning
Work piece material: AISI A48-45B
Cutting speed: 1100 m/min
Feed: 0.4 mm/rev
Depth of cut: 2 mm
Tool life criteria: Edge failure
The results are shown in Table 2.

Table 2

| | | | | | | | | Example 4 | Example 5 |
|---|---|---|---|---|---|---|---|---|---|
| | Example 2 | | | | Example 3 | | | Life | Life |
| | | Life time (min) | | | | | | | |
| Coating | Crater | Edge | S1 inserts | S2 inserts | Crater | Edge | Life time (min) | time (min) | time (min) |
| Inventive | | | | | | | | | |
| 1 | Good | Good | 36 | 33 | Good | Good | 27 | — | — |
| 2 | — | — | — | — | Good | Medium | 24 | — | — |
| 3 | Good/Medium | Good | 33 | 31 | Medium | Good | 27 | — | — |
| 4 | — | — | — | — | Good/Medium | Good/Medium | 21 | — | — |
| 5 | — | — | — | — | Good/Medium | Medium | 21 | — | — |
| 6 | Good | Good | 36 | 30 | Good | Good | 30 | 90 | 60 |
| Comparative | | | | | | | | | |
| 35 | — | — | — | — | Medium | Medium | 18 | — | — |
| 36 | — | — | — | — | Good | Medium/Poor | 21 | — | — |
| 37 | — | — | — | — | — | — | — | 70 | — |
| 38 | — | — | — | — | Good | Poor | 15 | — | — |
| 39 | — | — | — | — | Good | Poor | 18 | — | — |
| 40 | Poor | Good | 21 | 21 | Poor | Good | 15 | 60 | 45 |
| 41 | Good | Poor | 27 | 24 | Good/Medium | Poor | 21 | 70 | 50 |
| 42 | Medium | Medium | 24 | 24 | Medium | Medium | 18 | — | — |
| 43 | Good/Medium | Poor | 21 | 24 | — | — | — | — | — |
| 44 | Medium | Medium | 15 | 18 | Good/Medium | Medium/Poor | 15 | — | — |
| 45 | Good | Medium/Poor | 18 | 18 | Good | Medium/Poor | 18 | — | — |

It is obvious from the above examples that the inserts according to the invention show an increased tool performance with improved edge and crater wear characteristics.

The invention claimed is:

1. A cutting tool insert for machining by chip removal, comprising:
   a body, either as a solid insert or attached to a backing body; and
   a hard and wear resistant PVD coating, wherein
   said body is a polycrystalline cubic boron nitride compact (PCBN) containing at least 30 vol % of cubic phase boron nitride (cBN) in a binder comprising at least one compound selected from nitrides, borides, oxides, carbides and carbonitrides of one or more of the elements belonging to the groups 4, 5 and 6 of the periodic table and Al, and said coating comprises a columnar and polycrystalline nanolaminated structure of alternating A and B layers, where layer A is $(Ti_{1-x}Al_xMe1_p)N_a$, with $0.3<x<0.95$, $0.90<a<1.10$, $0 \leq p<0.15$, and Me1 is one or more of Zr, Y, V, Nb, Mo and W, layer B is $(Ti_{1-y-z}Si_yMe2_z)N_b$, with $0.05<y<0.25$, $0 \leq z<0.4$, $0.9<b<1.1$ and Me2 is one or more of Y, V, Nb, Mo, W and Al, with a thickness of the nanolaminated structure between 0.5 and 10 μm, an average column width between 20 and 1000 nm, and an average individual thickness of A and B layers between 1 and 50 nm.

2. The cutting tool insert according claim 1, wherein said nanolaminated structure comprises a phase mixture of cubic and hexagonal structures, as determined by X-ray diffraction.

3. The cutting tool insert according to claim 1, wherein $z=p=0$.

4. The cutting tool insert according to claim 1, wherein said coating comprises an inner single- and/or multilayer coating of TiN, TiC, Ti(C,N) or (Ti,Al)N, and/or an outer single- and/or multilayer coating of TiN, TiC, Ti(C,N), (Ti,Si)N or (Ti,Al)N, to a total coating thickness, including the thickness of the nanolaminated structure, of between 0.5 and 20 μm.

5. The cutting tool insert according to claim 1, wherein said PCBN body contains 30 vol %<cBN<70 vol %, with an average cBN grain size between 0.5 μm and 4 μm and a binder containing 80 wt %<Ti(C,N)<95 wt % and rest containing mainly other compounds comprising two or more of the elements selected from the group consisting of Ti, N, B, Ni, Cr, Mo, Nb, Fe, Al and O.

6. The cutting tool insert according to claim 1, wherein said PCBN body contains 45 vol %<cBN<70 vol with an average cBN grain size between 0.5 μm and 4 μm, and a binder containing 80 wt %<Ti(C,N)<90 wt %, 1 wt %<alloy containing one or more of the elements Ni, Co, Cr, and Mo<10 wt %, and rest containing mainly TiB; and $Al_2O_3$.

7. The cutting tool insert according to claim 1, wherein said PCBN body contains 70 vol %<cBN, with an average cBN grain size either between 0.5 μm and 10 μm, or between 10 μm and 25 μm, and a binder containing compounds of two or more of the elements selected from the group consisting of Al, B, N, W, Co, Ni, Fe, Al and O.

8. A method of making a cutting tool insert according to claim 1, comprising:
   depositing the coating by cathodic arc evaporation of alloyed or composite cathodes yielding the desired composition of the (Ti,Al,Me1)N and (Ti,Si,Me2)N layers using an evaporation current between 50 A and 200 A, in an Ar+$N_2$ atmosphere, at a total pressure of 0.5 Pa to 9.0 Pa, a bias between −10 V and −300 V, at 350° C. to 700° C.

9. A method for machining of steels, cast irons, super alloys and hardened steels which comprises:
   machining with the cutting tool insert according to claim 1 at cutting speeds of 50-2000 m/min, with an average feed of 0.01-1.0 mm/rev, depending on the cutting operation and insert geometry.

10. The cutting tool insert according to claim 2, wherein z=p=0.

11. The cutting tool insert according to claim 1, wherein 0.45<x<0.75.

12. The cutting tool insert according to claim 1, wherein 0.96<a<1.04.

13. The cutting tool insert according to claim 1, wherein 0.05<y<0.18.

14. The cutting tool insert according to claim 1, wherein 0.96<b<1.04.

15. The cutting tool insert according to claim 1, wherein the thickness of the nanolaminated structure is between 0.5 and 5 µm.

16. The cutting tool insert according to claim 4, wherein the thickness of the nanolaminated structure is between 0.5 and 10 µm.

17. The cutting tool insert according to claim 5, wherein said PCBN body contains 40 vol %<cBN<65 vol %.

18. The cutting tool insert according to claim 6, wherein said PCBN body contains 55 vol %<cBN<65 vol %.

19. The cutting tool insert according to claim 6, wherein the average cBN grain size is between 1 µm and 3 µm.

20. The cutting tool insert according to claim 6, wherein said PCBN body contains 80 vol %<cBN<95 vol %.

* * * * *